US012657496B2

(12) United States Patent (10) Patent No.: US 12,657,496 B2
Yamamoto et al. (45) Date of Patent: Jun. 16, 2026

(54) RESONATOR, OSCILLATOR, AND QUANTUM COMPUTER

(71) Applicant: NEC Corporation, Tokyo (JP)

(72) Inventors: Tsuyoshi Yamamoto, Tokyo (JP);
Tomohiro Yamaji, Tokyo (JP);
Yoshihito Hashimoto, Tokyo (JP)

(73) Assignee: NEC CORPORATION, Tokyo (JP)

( * ) Notice: Subject to any disclaimer, the term of this
patent is extended or adjusted under 35
U.S.C. 154(b) by 1137 days.

(21) Appl. No.: 17/626,588

(22) PCT Filed: Jun. 26, 2020

(86) PCT No.: PCT/JP2020/025257
§ 371 (c)(1),
(2) Date: Jan. 12, 2022

(87) PCT Pub. No.: WO2021/014891
PCT Pub. Date: Jan. 28, 2021

(65) Prior Publication Data
US 2022/0261676 A1 Aug. 18, 2022

(30) Foreign Application Priority Data
Jul. 19, 2019 (JP) ................................. 2019-133817

(51) Int. Cl.
G06N 10/40 (2022.01)
H03B 15/00 (2006.01)
(Continued)

(52) U.S. Cl.
CPC ........... G06N 10/40 (2022.01); H03B 15/003
(2013.01); H03K 3/38 (2013.01); H10N 60/10
(2023.02)

(58) Field of Classification Search
CPC ...................................................... G06N 10/40
See application file for complete search history.

(56) References Cited

U.S. PATENT DOCUMENTS 4,496,854 A * 1/1985 Chi .................... G01R 33/0354
327/527
8,169,231 B2 5/2012 Berkley
(Continued)

FOREIGN PATENT DOCUMENTS

CA 2968830 A1 11/2018
CN 107251250 A 10/2017
(Continued)

OTHER PUBLICATIONS

International Search Report for PCT Application No. PCT/JP2020/
025257, mailed on Sep. 15, 2020.
(Continued)

*Primary Examiner* — Paul A Wartalowicz
(74) *Attorney, Agent, or Firm* — Sughrue Mion, PLLC

(57) ABSTRACT

A resonator, an oscillator, and a quantum computer in which
both moderate nonlinearity and a low loss are achieved, and
the area occupied by the circuit can be reduced are provided.
A resonator (100) includes at least one loop circuit (110) in
which a first superconducting line (101), a first Josephson
junction (103), a second superconducting line (102), and a
second Josephson junction (104) are connected in a ring
shape, at least one third Josephson junction (130) provided
separately from the Josephson junction included in the loop
circuit (110), and a capacitor (120), in which the loop circuit
(110), the third Josephson junction (130), and the capacitor
(120) are connected in a ring shape.

7 Claims, 7 Drawing Sheets

10

(51) Int. Cl.
*H03K 3/38* (2006.01)
*H10N 60/10* (2023.01)

(56) References Cited

U.S. PATENT DOCUMENTS

| | | | |
|---|---|---|---|
| 8,195,726 B2 | 6/2012 | Macready et al. | |
| 8,854,074 B2 | 10/2014 | Berkley | |
| 10,097,143 B2 | 10/2018 | Abdo | |
| 10,483,980 B2 | 11/2019 | Sete et al. | |
| 10,586,911 B1 * | 3/2020 | Sandberg | H10N 60/0661 |
| 11,038,095 B2 | 6/2021 | Huang et al. | |
| 11,223,355 B2 | 1/2022 | Smith et al. | |
| 11,955,929 B2 * | 4/2024 | Yamamoto | G06N 10/00 |
| 12,021,520 B2 * | 6/2024 | Yamamoto | H03K 19/195 |
| 12,267,042 B2 * | 4/2025 | Yamamoto | H03B 15/00 |
| 2004/0077503 A1 | 4/2004 | Blais et al. | |
| 2008/0109500 A1 | 5/2008 | Macready et al. | |
| 2009/0078931 A1 | 3/2009 | Berkley | |
| 2015/0111754 A1 * | 4/2015 | Harris | H03K 3/38 |
| | | | 365/162 |
| 2017/0073106 A1 | 3/2017 | Dimer | |
| 2017/0085231 A1 | 3/2017 | Abdo | |
| 2018/0000110 A1 | 1/2018 | Elejalde et al. | |
| 2018/0010577 A1 | 1/2018 | Caponetti et al. | |
| 2018/0017803 A1 | 1/2018 | Goto | |
| 2018/0017978 A1 | 1/2018 | Goto | |
| 2018/0054165 A1 | 2/2018 | Szöcs et al. | |
| 2018/0145631 A1 | 5/2018 | Berkley et al. | |
| 2018/0240034 A1 | 8/2018 | Harris | |
| 2018/0260729 A1 | 9/2018 | Abdo et al. | |
| 2018/0341874 A1 | 11/2018 | Puri et al. | |
| 2018/0358539 A1 | 12/2018 | Goto | |
| 2019/0065981 A1 | 2/2019 | Chen et al. | |
| 2019/0156238 A1 | 5/2019 | Abdo | |
| 2019/0229690 A1 | 7/2019 | White et al. | |
| 2020/0320426 A1 * | 10/2020 | Amin | G06N 10/40 |
| 2021/0201188 A1 | 7/2021 | Yamaji et al. | |
| 2021/0263705 A1 | 8/2021 | Kanao et al. | |
| 2021/0350268 A1 | 11/2021 | Whittaker et al. | |
| 2022/0247407 A1 | 8/2022 | Yamamoto et al. | |
| 2022/0261676 A1 | 8/2022 | Yamamoto et al. | |
| 2022/0263467 A1 | 8/2022 | Yamamoto et al. | |
| 2022/0263468 A1 | 8/2022 | Yamamoto et al. | |
| 2022/0318660 A1 | 10/2022 | Hasegawa et al. | |
| 2022/0399145 A1 | 12/2022 | Kirichenko et al. | |
| 2023/0073224 A1 | 3/2023 | Schuster et al. | |
| 2023/0163762 A1 | 5/2023 | Yamaji et al. | |
| 2023/0216495 A1 | 7/2023 | Yamaji et al. | |

FOREIGN PATENT DOCUMENTS

| | | | |
|---|---|---|---|
| CN | 116822641 | A | 9/2023 |
| JP | H09-139528 | A | 5/1997 |
| JP | 2005-527902 | A | 9/2005 |
| JP | 2017-73106 | A | 4/2017 |
| JP | 2018-010577 | A | 1/2018 |
| JP | 2018-011022 | A | 1/2018 |
| JP | 2018-513580 | A | 5/2018 |
| JP | 2018-533106 | A | 11/2018 |
| JP | 2019-003975 | A | 1/2019 |
| JP | 2019-036625 | A | 3/2019 |
| JP | 2019-041088 | A | 3/2019 |
| JP | 6542165 | B2 | 7/2019 |
| WO | 2016/183213 | A1 | 11/2016 |
| WO | 2018/052427 | A1 | 3/2018 |
| WO | 2018/162965 | A1 | 9/2018 |

OTHER PUBLICATIONS

S. Puri, et al., "Quantum annealing with all-to-all connected nonlinear oscillators", Nature Communications., Published Jun. 8, 2017, DOI: 10.1038/ncomms15785, pp. 1-9.

Japanese Office Action for JP Application No. 2021-533889 mailed on Nov. 1, 2022 with English Translation.

Hayato Goto, Quantum Computation Based on Quantum Adiabatic Bifurcations of Kerr-Nonlinear Parametric Oscillators, arXiv, Aug. 31, 2018.

International Search Report for PCT Application No. PCT/JP2020/025240, mailed on Sep. 29, 2020.

U.S. Office Action for U.S. Appl. No. 17/626,576 mailed on Aug. 28, 2023.

U.S. Office Action for U.S. Appl. No. 17/625,413 mailed on May 23, 2024.

JP Official Communication for JP Application No. 2022-199644, mailed on Feb. 13, 2024 with English Translation.

JP Official Communication for JP Application No. 2021-533886, mailed on Nov. 15, 2022 with English Translation.

International Search Report for PCT Application No. PCT/JP2020/025244, mailed on Sep. 24, 2020.

International Search Report for PCT Application No. PCT/JP2020/025234, mailed on Sep. 15, 2020.

U.S. Office Action for U.S. Appl. No. 18/589,512 mailed on May 2, 2025.

* cited by examiner

61

RESONATOR, OSCILLATOR, AND QUANTUM COMPUTER

This application is a National Stage Entry of PCT/JP2020/025257 filed on Jun. 26, 2020, which claims priority from Japanese Patent Application 2019-133817 filed on Jul. 19, 2019, the contents of all of which are incorporated herein by reference, in their entirety.

TECHNICAL FIELD

The present invention relates to a resonator, an oscillator, and a quantum computer. In particular, the present invention relates to a resonator, an oscillator, and a quantum computer using a superconducting circuit.

BACKGROUND ART

Researches on circuits using superconducting elements have been conducted. For example, Patent Literature 1 discloses a high-frequency oscillator using a superconducting element. Further, recently, researches on quantum computers using superconducting elements have also been conducted. For example, Patent Literatures 2 and 3 and Non-patent Literature 1 propose a quantum computer using a network of nonlinear oscillators. The nonlinear oscillators used in such quantum computers are required to have moderate nonlinearity and as low losses as possible. Note that the nonlinearity of the nonlinear oscillator is quantified by a nonlinear coefficient. The nonlinear coefficient is a coefficient defined by a coefficient of a nonlinear term of the Hamiltonian of the nonlinear oscillator as will be described later.

CITATION LIST

Patent Literature

Patent Literature 1: Japanese Unexamined Patent Application Publication No. H09-139528
Patent Literature 2: Japanese Unexamined Patent Application Publication No. 2017-73106
Patent Literature 3: Japanese Unexamined Patent Application Publication No. 2018-11022

Non Patent Literature

Non-patent Literature 1: S. Puri, et al, "Quantum annealing with all-to-all connected nonlinear oscillators," Nature Comm., 2017.

SUMMARY OF INVENTION

Technical Problem

Each of the aforementioned Patent Literatures 2 and 3 and Non-patent Literature 1 discloses a configuration of a quantum computer in which a distributed constant-type Josephson parametric oscillator is used as a nonlinear oscillator. The distributed constant-type Josephson parametric oscillator is composed of a distributed constant-type resonator and a Josephson junction. The distributed constant-type resonator has a length roughly equal to the wavelength of an electromagnetic wave corresponding to the oscillation frequency of the parametric oscillator on a circuit board. Note that the aforementioned circuit board refers to a substrate on which a Josephson parametric oscillator is formed. In general, the aforementioned oscillation frequency is, for example, about 10 GHz, so that the length of the distributed constant-type resonator corresponding to this frequency is in the order of millimeters. Therefore, the length of the distributed constant-type resonator is very long.

Meanwhile, in order to realize a practical quantum computer, it is necessary to integrate, for example, several thousands of nonlinear oscillators on a chip of several millimeters square. However, there is a problem that the distributed constant-type Josephson parametric oscillator is not suitable for such integration because the area occupied by the resonator thereof is too large.

An object of the present disclosure is to provide a resonator, an oscillator, and a quantum computer in which both moderate nonlinearity and a low loss are achieved, and the area occupied by the circuit can be reduced.

Solution to Problem

A resonator according to an example embodiment includes:
  at least one loop circuit in which a first superconducting line, a first Josephson junction, a second superconducting line, and a second Josephson junction are connected in a ring shape;
  at least one third Josephson junction provided separately from the Josephson junction included in the loop circuit; and
  a capacitor, in which
  the loop circuit, the third Josephson junction, and the capacitor are connected in a ring shape.

Advantageous Effects of Invention

According to the above-described configuration, it is possible to provide a resonator, an oscillator, a quantum computer in which both moderate nonlinearity and a low loss are achieved, and the area occupied by the circuit can be reduced.

EXAMPLE EMBODIMENTS

Figure 1:
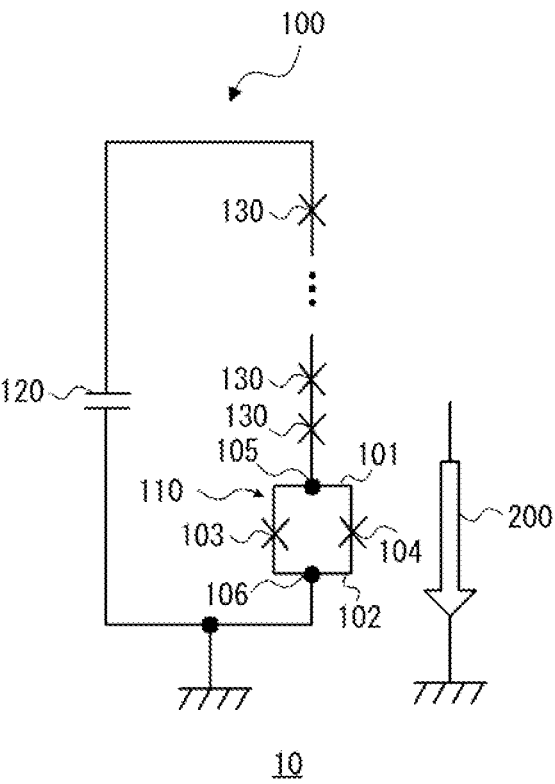
FIG. 1 is a schematic diagram showing an example of a lumped constant-type Josephson parametric oscillator according to a first example embodiment.

Details of an example embodiment will be described hereinafter. Note that a resonator described in the example embodiment is implemented by, for example, lines (wiring lines) formed of a superconductor on a silicon substrate. For example, while Nb (niobium) or Al (aluminum) is, for example, used as a material of this line, any other metal such as Mo (molybdenum) or Ta (tantalum) which is in a super-conducting state when it is cooled to an extremely low temperature may be used. Further, in order to achieve the superconducting state, a circuit of the resonator is used in a temperature environment such as 10 mK (milli-Kelvin) achieved in a freezer.

Further, in the following description, the Josephson junction means an element including a structure in which a thin insulating film is sandwiched between a first superconductor and a second superconductor.

Further, the same reference numerals (or symbols) are assigned to the same components throughout the drawings, and detailed descriptions thereof are omitted as appropriate.

First Example Embodiment

As mentioned above, the distributed constant-type Josephson parametric oscillator is not suitable for the inte-gration because the area occupied by the resonator thereof is too large. In order to solve this problem and thereby to realize a practical quantum computer, it is necessary to realize a lumped constant-type Josephson parametric oscil-lator. FIG. 1 is a schematic diagram showing an example of a lumped constant-type Josephson parametric oscillator 10 according to a first example embodiment. Note that, in the following description, the Josephson parametric oscillator (the nonlinear oscillator) is simply referred to as an oscil-lator.

As shown in FIG. 1, an oscillator 10 includes a resonator 100 and a magnetic-field generation unit 200. The resonator 100 includes a loop circuit 110, Josephson junctions 130, and a capacitor 120. The loop circuit 110 includes a first superconducting line 101 that connects a first Josephson junction 103 and a second Josephson junction 104, and a second superconducting line 102 that connects the first Josephson junction 103 and the second Josephson junction 104. In other words, the resonator 100 includes the loop circuit 110 in which the first and second superconducting lines 101 and 102 are joined by the first and second Josephson junctions 103 and 104. As shown in FIG. 1, the first superconducting line 101, the first Josephson junction 103, the second superconducting line 102, and the second Josephson junction 104 are connected in a ring shape (i.e., in a circular fashion), thereby forming the loop circuit 110. In other words, in the loop circuit 110, the first and second superconducting lines 101 and 102 are joined by the first and second Josephson junctions 103 and 104, thereby forming a loop. That is, it can also be said that the loop circuit 110 is a DC-SQUID (Superconducting QUantum Interference Device). In this example embodiment, the resonator 100 includes one loop circuit 110. However, as shown in a modified example described later, the resonator 100 may include a plurality of loop circuits 110.

The Josephson junctions 130 are those provided sepa-rately from the Josephson junctions 103 and 104 included in the loop circuit 110. The resonator 100 includes at least one Josephson junction 130. That is, the resonator 100 may include a plurality of Josephson junctions 130. The Joseph-son junctions 130 and the loop circuit 110 are connected in series. Note that although a plurality of Josephson junctions 130 are connected in series with one another as a group of junctions (i.e., connected in series with each other in one place) in FIG. 1, the order of these junctions may be arbitrarily determined. Therefore, for example, the loop circuit 110 and the Josephson junctions 130 may be con-nected in series so that they are arranged in an alternate manner.

In the loop circuit 110, a first part 105 in the first superconducting line 101 and a second part 106 in the second superconducting line 102 are used for this series connection. That is, the first and second parts 105 and 106 serve as connection points in the series connection. Note that the first part 105 is an arbitrary part of the first supercon-ducting line 101. That is, the position of the first part 105 in the first superconducting line 101 is not limited to any particular place. Similarly, the second part 106 is an arbitrary part of the second superconducting line 102. That is, the position of the second part 106 in the second superconduct-ing line 102 is not limited to any particular place. Note that the first and second parts 105 and 106 can also be regarded as the input and output terminals of the DC-SQUID.

Further, in the Josephson junctions 130, both terminals of the Josephson junctions 130 serve as connection points in the series connection.

A circuit in which the loop circuit 110 and the Josephson junctions 130 are connected in series is shunted by the capacitor 120. That is, it can be said that, by connecting the loop circuit 110, the Josephson junctions 130, and the capacitor 120 in a ring shape, a loop circuit in which the loop circuit 110 is incorporated on the line of the loop is formed. Note that as shown in FIG. 1, the loop circuit in which the loop circuit 110, the Josephson junctions 130, and the capacitor 120 are connected in a ring shape may be con-nected to the ground.

The magnetic-field generation unit 200 and the resonator 100 are magnetically coupled with each other through the mutual inductance. In other words, the magnetic-field gen-eration unit 200 and the resonator 100 are inductively coupled with each other. The magnetic-field generation unit 200 is a circuit that generates an alternating magnetic field and applies the generated alternating magnetic field to the loop circuit 110. The magnetic-field generation unit 200 is a circuit through which an AC (Alternating Current) current flows, and generates an alternating magnetic field by the AC current. More specifically, a current in which a DC (Direct Current) current and an AC current are superimposed on each other flows through the magnetic-field generation unit 200. Note that the frequency of the generated alternating magnetic field is equal to the frequency of this AC current. The magnitude of the magnetic flux and the height of the oscillation frequency (the resonance frequency) are con-trolled by the amount of the DC current. The resonance frequency of the resonator 100, i.e., the oscillation frequency of the oscillator 10, depends on the equivalent inductance of the loop circuit 110. Further, this equivalent inductance depends on the magnitude of the magnetic flux that passes through the loop of the loop circuit 110. The magnitude of the magnetic flux that passes through the loop depends on the amount of the DC current that flows through the mag-netic-field generation unit 200. Therefore, as described above, the height of the oscillation frequency (the resonance frequency) is controlled by the amount of the DC current. Although the magnetic-field generation unit 200 is repre-sented by one wiring line in FIG. 1, it may be formed by two wiring lines, and may be configured so that the DC current flows through one of the wiring lines and the AC current flows through the other wiring line.

When an AC current is fed to the magnetic-field genera-tion unit 200 so that an alternating magnetic field whose frequency is twice the resonance frequency of the resonator

100 is applied to the loop circuit 110, the oscillator 10 oscillates at this resonance frequency (i.e., the oscillation frequency 0.5 times (i.e., a half of) the frequency of the alternating magnetic field). This oscillation is called parametric oscillation.

The nonlinear coefficient of the oscillator 10 shown in FIG. 1 will be examined hereinafter. An approximate expression of the Hamiltonian H of the oscillator 10 shown in FIG. 1 (the Hamiltonian H of the resonator 100) is expressed by the below-shown Expression (1).

[Expression 1]

$$H = hf_0 a^\dagger a - \frac{E_C}{12} \frac{1 + (N-1)\alpha^3}{(1 + (N-1)\alpha)^3} (a^\dagger + a)^4 \qquad (1)$$

In the Expression (1), h is the Planck's constant. Further, $f_0$ is the oscillation frequency of the oscillator 10. $a^\dagger$ is a creation operator. a is an annihilation operator. $E_C$ is the Josephson energy of one Josephson junction 130. N is the number of Josephson junctions 130. That is, N is an integer equal to or greater than one. $\alpha$ is a ratio of the critical current value of the loop circuit 110 to that of the Josephson junction 130. Note that the critical current values of the Josephson junctions 103 and 104 are equal to each other, and they are both represented by $I_{c1}$. Further, the critical current value of each of the Josephson junctions 130 is represented by $I_{c2}$. That is, a relation $\alpha = I_{c1}/I_{c2}$ holds. It can also be expressed that the critical current value $I_{c1}$ of the loop circuit 110 is $\alpha$ times the critical current value $I_{c2}$ of the Josephson junction 130.

The nonlinear coefficient of a nonlinear oscillator is defined by the coefficient of the nonlinear term of the Hamiltonian of the nonlinear oscillator, and is proportional to the coefficient of the nonlinear term. In the Hamiltonian of the Expression (1), the second term, i.e., the term $(a^\dagger + a)^4$, is the nonlinear term. Therefore, the value of the nonlinear coefficient of the oscillator 10 is proportional to the coefficient of the term $(a^\dagger + a)^4$. As can be seen from the Expression (1), the coefficient of the nonlinear term decreases as the number N of Josephson junctions 130 increases. This is because while the numerator of the coefficient of the nonlinear term changes in proportion to the first power of N, the denominator changes in proportion to the third power of N. This means that the nonlinearity of the oscillator 10 can be freely designed by changing the number N of Josephson junctions 130. That is, it is possible to reduce the nonlinearity coefficient according to the number N of Josephson junctions 130.

As described above, in this example embodiment, the resonator is not formed by the ring-shaped circuit composed solely of the loop circuit 110 and the capacitor 120, but is formed by the circuit in which the loop circuit 110, the Josephson junctions 130, and the capacitor 120 are connected in a ring shape. In this way, it is possible to freely design the nonlinearity of the oscillator 10 by changing the number N of Josephson junctions 130. That is, it is possible to reduce the nonlinear coefficient to a moderate value required for a quantum computer. In contrast, for example, in the case where a resonator is formed by using a ring circuit composed of only the loop circuit 110 and the capacitor 120, the nonlinearity of an oscillator using this resonator depends on the magnitude of the capacitance of the capacitor 120. In this case, the more the capacitance of the capacitor 120 is increased, the more the nonlinear coefficient of the oscillator can be reduced. However, as the capacitance is increased, the loss increases. That is because, in order to manufacture a large capacitance in a sufficiently small area suitable for an integrated circuit, it is necessary to use a capacitor having a multi-layered structure. However, in the case of the capacitor having a multi-layered structure, it is difficult to manufacture, by using the existing technology, a dielectric layer the loss caused by which is small. Note that the dielectric layer is a layer of a dielectric material formed between two electrodes of a capacitor. In contrast, in this example embodiment, the nonlinear coefficient can be reduced by the Josephson junction 130, instead of by the capacitance of the capacitor 120 as described above. Therefore, it is possible to reduce that the nonlinear coefficient to a moderate value required for a quantum computer without increasing the loss of the oscillator. Further, the lumped constant-type oscillator is formed in this example embodiment. In the case of the lumped constant-type oscillator, there is no need to use a resonator having roughly the same length as the wavelength of an electromagnetic wave corresponding to the oscillation frequency, so that the area occupied by the circuit can be reduced. That is, it is possible to achieve both moderate nonlinearity and a low loss, and to reduce the area occupied by the circuit.

Figure 2:
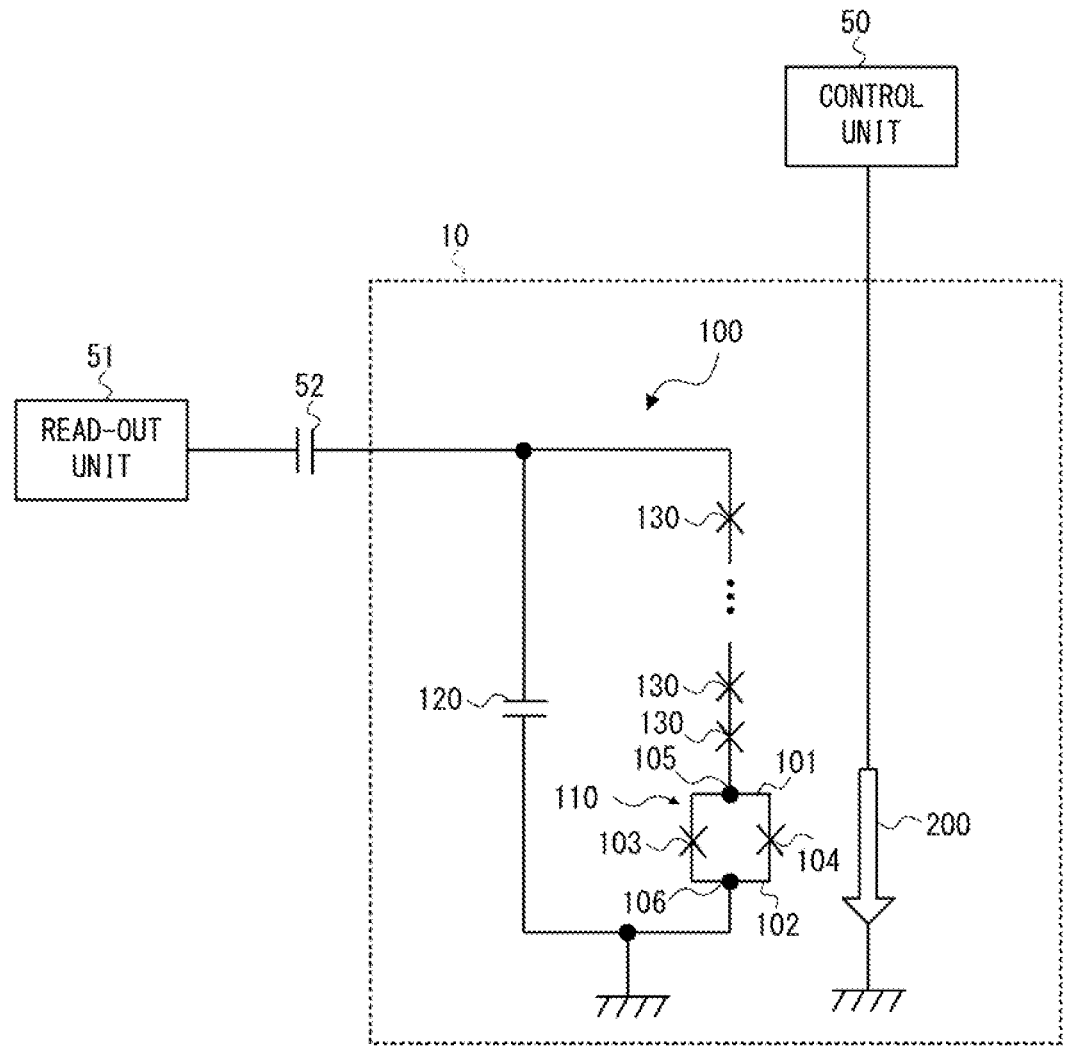
FIG. 2 is a schematic diagram showing a configuration for controlling an oscillator and performing reading-out therefrom according to the first example embodiment.

FIG. 2 is a schematic diagram showing a configuration for controlling the oscillator 10 and performing reading-out therefrom according to this example embodiment. The configuration shown in FIG. 2 is used, for example, as a quantum-bit circuit for a quantum computer as will be described later.

In the configuration shown in FIG. 2, a control unit 50 and a read-out unit 51 are added in the configuration shown in FIG. 1. The control unit 50 is a circuit connected to the magnetic-field generation unit 200 of the oscillator 10, and supplies, to the magnetic-field generation unit 200, a DC current for controlling the oscillation frequency of the oscillator 10 and an AC current for making the oscillator 10 oscillate. The read-out unit 51 is a circuit connected to the resonator 100 through a capacitor 52, and reads out the internal state, i.e., the oscillation state, of the oscillator 10. Note that, in the configuration shown in FIG. 2, the read-out unit 51 is connected to the loop circuit composed of the loop circuit 110, the Josephson junction 130, and the capacitor 120 through the capacitor 52.

Modified Example of First Example Embodiment

Figure 3:
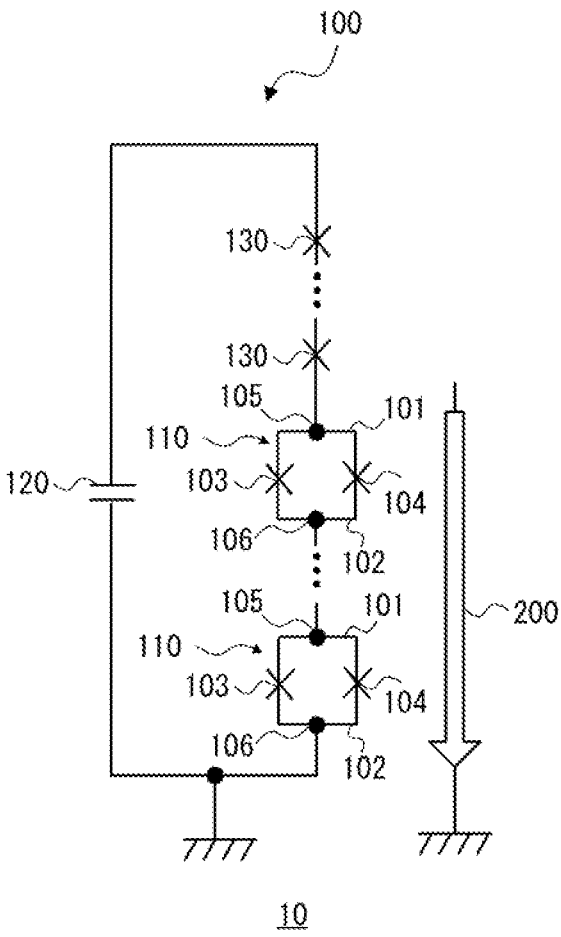
FIG. 3 is a schematic diagram showing a configuration of a Josephson parametric oscillator according to a modified example of the first example embodiment.

In the above-described first example embodiment, the resonator 100 includes one loop circuit 110. However, as shown in FIG. 3, the resonator 100 may include a plurality of loop circuits 110. The resonator 100 shown in FIG. 3 includes a plurality of loop circuits 110, at least one Josephson junction 130, and a capacitor 120.

In the modified example, the Josephson junctions 130 and the loop circuits 110 are also connected in series. Note that although a plurality of Josephson junctions 130 are connected in series with one another as a group of junctions (i.e., in one place) and a plurality of loop circuits 110 are connected in series with one another as a group of loop circuits (i.e., in another place) in FIG. 3, the order of these Josephson junctions and loop circuits may be arbitrarily determined. Therefore, for example, the loop circuit 110 and the Josephson junctions 130 may be connected in series so that they are arranged in an alternate manner.

Further, in the modified example, in the loop circuits 110, the first and second parts 105 and 106 also serve as connection points in the series connection. Further, in the Josephson junctions 130, both terminals of the Josephson junctions 130 serve as connection points in the series connection.

In the modified example, a circuit in which a plurality of loop circuits 110 and at least one Josephson junction 130 are connected in series is shunted by the capacitor 120. That is, it can be said that, by connecting a plurality of loop circuits 110, at least one Josephson junction 130, and the capacitor 120 in a ring shape, a loop circuit in which the plurality of loop circuits 110 are incorporated on the line of the loop is formed. Note that as shown in FIG. 3, the loop circuit in which the loop circuits 110, the Josephson junctions 130, and the capacitor 120 are connected in a ring shape may be connected to the ground.

In the modified example, the magnetic-field generation unit 200 also generates an alternating magnetic field and applies the generated alternating magnetic field to the loop circuits 110. However, while the magnetic-field generation unit 200 applies an alternating magnetic field to one loop circuit 110 in the first example embodiment, the magnetic-field generation unit 200 applies an alternating magnetic field to the plurality of loop circuits 110 in the modified example. Therefore, the wiring line of the magnetic-field generation unit 200 has a length that is determined according to the number of loop circuits 110. Although the magnetic-field generation unit 200 is also represented by one wiring line in the modified example shown in FIG. 3, it may be formed by two wiring lines, and may be configured so that the DC current flows through one of the wiring lines and the AC current flows through the other wiring line.

When an AC current is fed to the magnetic-field generation unit 200 so that an alternating magnetic field whose frequency is twice the resonance frequency of the resonator 100 is applied to each of the loop circuits 110, the oscillator 10 oscillates at this resonance frequency (i.e., the oscillation frequency 0.5 times (i.e., a half of) the frequency of the alternating magnetic field).

The nonlinear coefficient of the oscillator 10 shown in FIG. 3 will be examined hereinafter. As described above, each of the loop circuits 110 is a circuit including Josephson junctions 103 and 104. Therefore, by regarding the loop circuit 110 as a circuit equivalent to Josephson junctions, it can be considered that increasing the number of loop circuits 110 to a plural number as in the case of this modified example is equivalent to increasing the number of Josephson junctions. As understood from the above-shown the Expression (1), the magnitude of the nonlinearity coefficient decreases according to the number of Josephson junctions. Therefore, the magnitude of the nonlinearity coefficient of the oscillator 10 decreases as the number of loop circuits 110 is increased. Therefore, the number of loop circuits 110 provided in the oscillator 10 does not necessarily have to be one. However, for the below-described reason, the number of loop circuits 110 is preferably one.

The loop circuit 110, i.e., the DC-SQUID, is a circuit that is affected by noises of the magnetic field. Therefore, as the number of loop circuits is increased, the circuits become more sensitive to the noises of the magnetic field, thus possibly increasing the probability of the malfunction of the circuits. Further, the length of the wiring line of the magnetic-field generation unit 200 for uniformly applying the magnetic field to the plurality of loop circuits 110 increases according to the number of loop circuits 110. Therefore, the number of the loop circuits 110 is preferably one.

Second Example Embodiment

Figure 4:
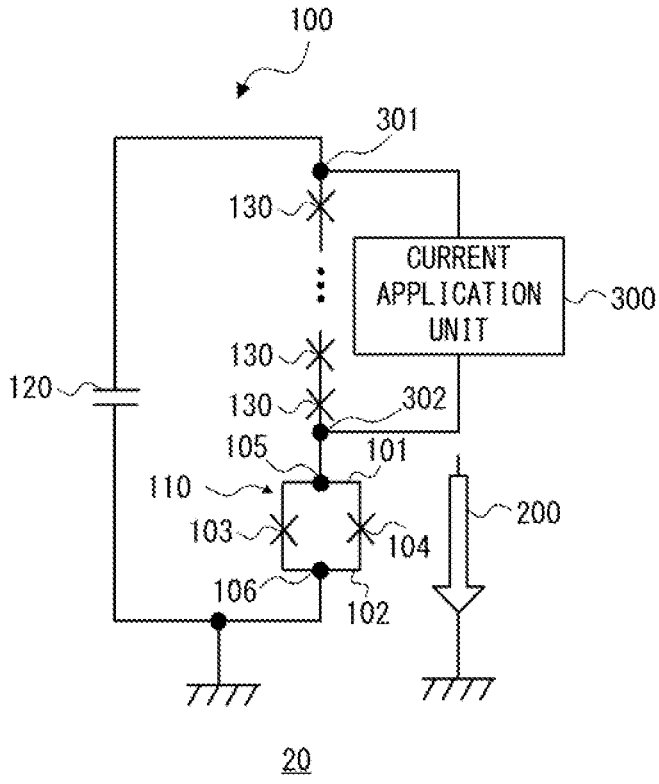
FIG. 4 is a schematic diagram showing a configuration of a Josephson parametric oscillator according to a second example embodiment.

Next, a second example embodiment will be described. FIG. 4 is a schematic diagram showing an example of a lumped constant-type Josephson parametric oscillator 20 according to the second example embodiment. This example embodiment differs from the first example embodiment because the oscillator further includes a current application unit 300. The current application unit 300 is a circuit that applies a DC current having a predetermined current value to the Josephson junctions 130. In the example shown in FIG. 4, the input and output terminals of the current application unit 300 are connected to one end 301 and the other end 302 of a circuit composed of all the Josephson junctions 130 connected in series. In this way, a closed circuit including the current application unit 300 and the Josephson junctions 130 is formed. Therefore, the DC current output from the current application unit 300 flows through all the Josephson junctions 130 and returns to the current application unit 300.

Note that the equivalent inductance $L_J$ of the Josephson junction 130 is expressed by the below-shown Expression.

[Expression 2]

$$L_J = \frac{\Phi_0}{2\pi I_C} \frac{1}{\sqrt{1 - (I/I_C)^2}} \tag{2}$$

In the Expression (2), $\Phi_0$ is the magnetic flux quantum (about $2.07 \times 10^{-15}$ Wb), and $I_C$ is the critical current value of the Josephson junction 130. Further, I is the current flowing through the Josephson junction 130. From the above-shown Expression, it can be understood that the equivalent inductance $L_J$ of the Josephson junction 130 can be changed by changing the current I flowing through the Josephson junction 130. That is, it is possible to control the equivalent inductance $L_J$ of the Josephson junction 130 by controlling the current flowing from the current application unit 300 to the Josephson junction 130.

Similarly to a simple LC resonant circuit, the resonance frequency of the resonator 100 depends on the inductance and the capacitance of the resonator 100. That is, the resonance frequency of the resonator 100 can be changed by changing the inductance thereof. In this example embodiment, the equivalent inductance $L_J$ of the Josephson junction 130 can be controlled by having the current application unit 300 feed a DC current to the Josephson junction 130. In this way, it is also possible to control the equivalent inductance of the whole resonator 100, and as a result, to control the resonance frequency of the resonator (i.e., the oscillation frequency of the oscillator 20). As described above, this example embodiment further provides, in addition to the advantageous effect of the first example embodiment, another advantageous effect that it is possible to implement frequency control other than the control of the resonance frequency by the DC current flowing through the magnetic-field generation unit 200.

Note that although the current application unit 300 is connected so that the DC current is fed to all the Josephson junctions 130 in the example shown in FIG. 4, the current application unit 300 may be connected so that the DC current is applied to some of the Josephson junctions 130.

Further, although the plurality of Josephson junctions 130 are connected together in series and the plurality of loop circuits 110 are connected together in series in FIG. 4, the order of these components is arbitrarily determined. Therefore, for example, the loop circuit 110 and the Josephson junctions 130 may be connected in series so that they are arranged in an alternate manner.

Similarly to the first example embodiment, in the oscillator 20 according to this example embodiment, a circuit in which a control unit 50 and a read-out unit 51 are added as shown in FIG. 2 may be formed. Note that, in this case, the read-out unit 51 is connected to a loop circuit composed of a plurality of loop circuits 110, at least one Josephson junction 130, and a capacitor 120 through the capacitor 52.

Modified Example of Second Example Embodiment

Figure 5:
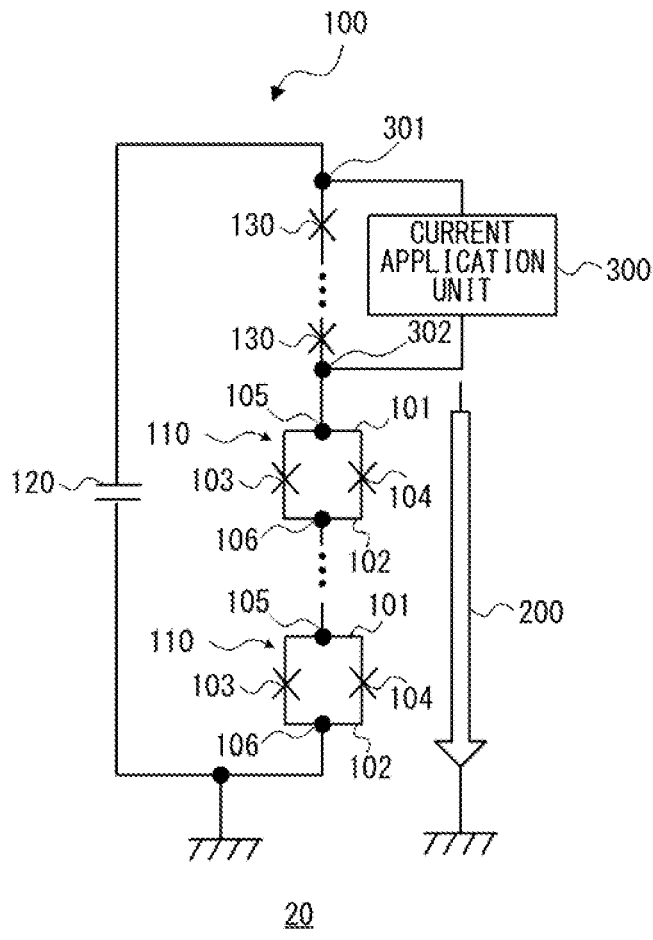
FIG. 5 is a schematic diagram showing a configuration of a Josephson parametric oscillator according to a modified example of the second example embodiment.

A modified example similar to that of the first example embodiment is conceivable for the second modified example. That is, as shown in FIG. 5, the resonator 100 of the oscillator 20 may include a plurality of loop circuits 110. Since the configuration of the modified example of the second example embodiment is similar to that of the first example embodiment, except for the addition of the current application unit 300, the descriptions of details of the configuration are omitted as appropriate.

In this modified example, the current application unit 300 may also be connected so that the DC current is applied to some of the Josephson junctions 130.

Further, although a plurality of Josephson junctions 130 are connected together in series and a plurality of loop circuits 110 are connected together in series in FIG. 5, the order of these components is arbitrarily determined. Therefore, for example, the loop circuit 110 and the Josephson junctions 130 may be connected in series so that they are arranged in an alternate manner.

Third Example Embodiment

Next, an example embodiment in which the above-described oscillator 10 or 20 is used as a quantum-bit circuit for a quantum computer will be described. Note that the term "quantum computer" means a quantum annealing-type computer that calculates a solution of an arbitrary problem that can be mapped onto an Ising model. As described above, each of the oscillators 10 and 20 performs parametric oscillation when an alternating magnetic field having a frequency twice the resonance frequency is applied to its loop circuit 110. Note that the oscillation state can be either a first oscillation state or a second oscillation state the phases of which are different from each other by $\pi$. The first and second oscillation states correspond to quantum bits 0 and 1, respectively.

Figure 6:
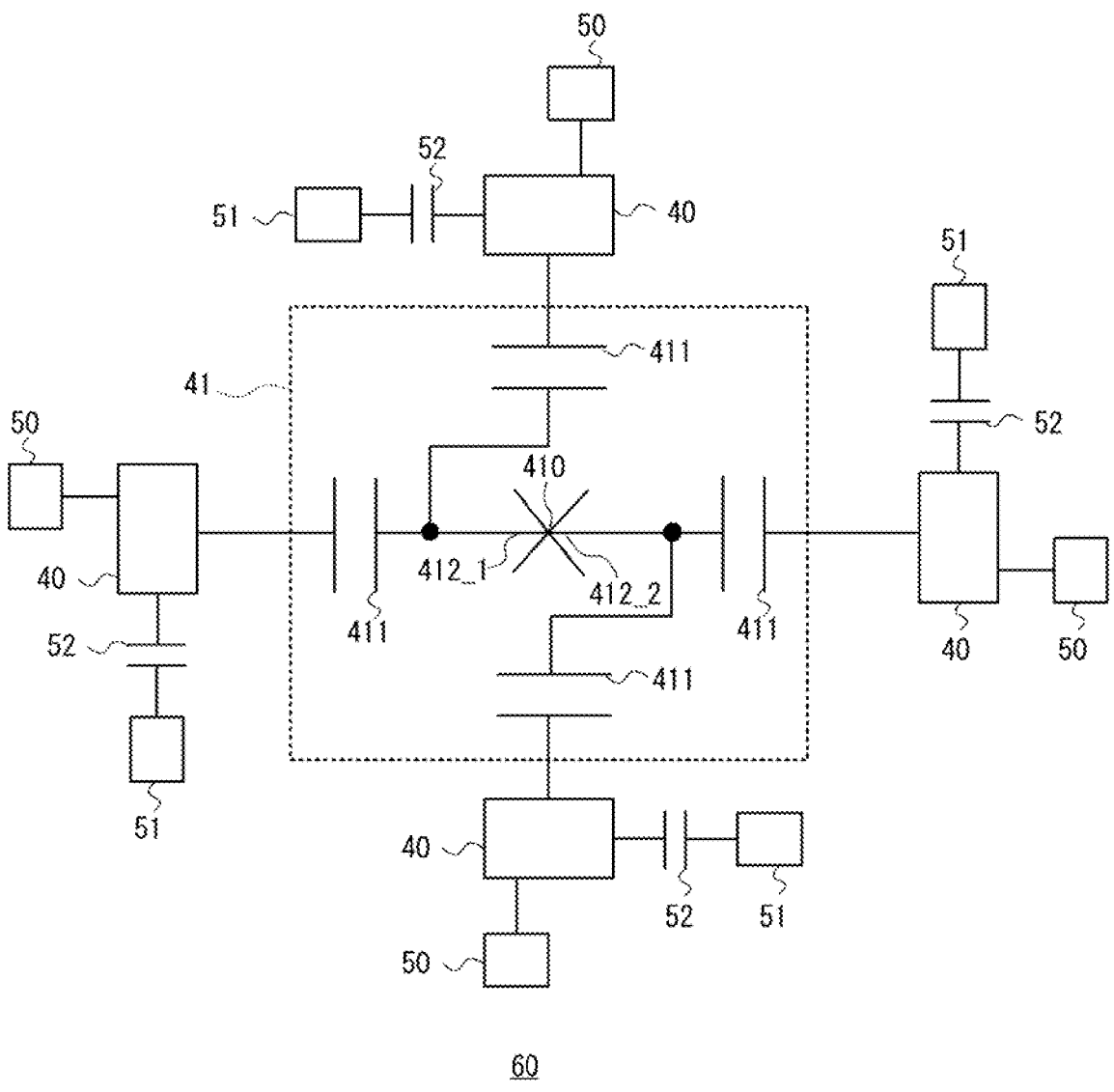
FIG. 6 is a schematic diagram showing a configuration of a quantum computer using an oscillator shown in an example embodiment or a modified example.

FIG. 6 is a schematic diagram showing a configuration of a quantum computer using the oscillator 10 or 20. The configuration shown in FIG. 6 is a configuration that is obtained by, in the configuration of the quantum computer using a distributed constant-type superconducting parametric oscillator disclosed in Non-patent Literature 1, applying the above-described oscillator 10 or 20 in place of the distributed constant-type superconducting parametric oscillator. More specifically, the configuration shown in FIG. 6 is obtained by, for example, in the configuration shown in FIG. 4 of Non-patent Literature 1, applying the above-described oscillator 10 or 20 in place of the distributed constant-type superconducting parametric oscillator. In FIG. 6, the oscillator 40 represents the oscillator 10 or 20.

In the quantum computer 60 shown in FIG. 6, four oscillators 40 are connected by one coupling circuit 41. More specifically, the coupling circuit 41 is connected to the loop circuit in which the loop circuit 110, the Josephson junction 130, and the capacitor 120 are connected in a ring shape in the oscillator 40. As shown in FIG. 2, a control unit 50 and a read-out unit 51 are connected to a respective oscillator 40. That is, the control unit 50 is connected to the magnetic-field generation unit 200 of the oscillator 40. Further, the read-out unit 51 is connected to the loop circuit in which the loop circuit 110, the Josephson junction 130, and the capacitor 120 are connected in a ring shape in the oscillator 40 through the capacitor 52. The coupling circuit 41 is a circuit that couples the four oscillators 40, and is formed by one Josephson junction 410 and four capacitors 411. More specifically, the coupling circuit 41 couples ring circuits each of which includes the capacitor 120, the loop circuit 110, and the Josephson junction 130 in oscillators 40 with each other. The coupling circuit 41 couples a first set of oscillators composed of two of the four oscillators 40 with a second set of oscillators composed of the other two oscillators 40 through the Josephson junction 410. Note that each of the first set of oscillators is connected to a super-conductor 412_1 through a respective capacitor 411. Further, each of the second set of oscillators is connected to a superconductor 412_2 through a respective capacitor 411. Note that the superconductor 412_1 is a wiring line connected to one of the terminals of the Josephson junction 410, and the superconductor 412_2 is a wiring line connected to the other terminal of the Josephson junction 410. That is, it can be said that the superconductors 412_1 and 412_2 are joined by the Josephson junction 410.

That is, a first oscillator 40 in the first set of oscillators is connected to one of the terminals of the Josephson junction 410 through a first capacitor 411. Further, a second oscillator 40 in the first set of oscillators is connected to one of the terminals of the Josephson junction 410 through a second capacitor 411. Similarly, a third oscillator 40 in the second set of oscillators is connected to the other terminal of the Josephson junction 410 through a third capacitor 411. Further, a fourth oscillator 40 in the second set of oscillators is connected to the other terminal of the Josephson junction 410 through a fourth capacitor 411.

The control unit 50 uses AC currents having frequencies different from each other for the four oscillators 40. When the magnetic-field generation unit 200 is formed by two wiring lines, and a DC current is fed to one of the wiring lines and an AC current is fed to the other wiring line, the wiring line for the AC current may be a wiring line that is shared (i.e., commonly used) by a plurality of oscillators 40. That is, the wiring line for the AC current may be formed so as to pass through (or pass near) the plurality of the oscillators 40. In this case, in order to control the plurality of oscillators 40, a plurality of current control units 50 are connected to the wiring line for the AC current, which is shared by the plurality of oscillators 40. Further, AC currents having frequencies different from each other are superimposed by the current control units 50.

Note that, in the configuration shown in FIG. 6, the control unit 50 may be arranged in a distributed manner in order to control the respective oscillators 40. Alternatively, the plurality of control unit 50 may be collectively disposed in one place. When each of the oscillators 40 includes the above-described current application unit 300, the current application units 300 may be arranged in a distributed manner for the respective oscillators 40, or may be collectively disposed in one place. Further, although the four read-out units 51 are used in the configuration shown in FIG. 6, one read-out unit 51 may read out the internal states of the four oscillators 40. In this case, the common read-out unit 51 provided for the plurality of oscillators 40 reads out the internal state of each of the oscillators 40 while distinguishing them from each other according to the difference in the frequencies used in the respective oscillators 40.

Figure 7:
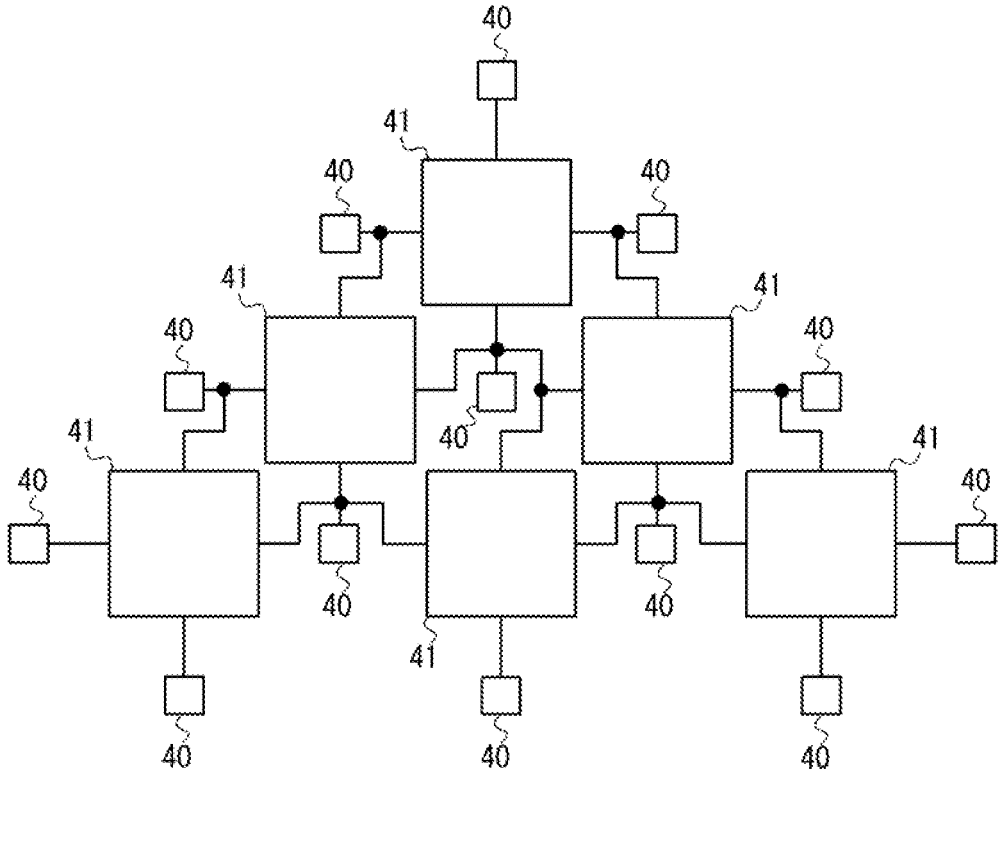
FIG. 7 is a schematic diagram showing a configuration of a quantum computer in which oscillators are integrated.

Note that the configuration shown in FIG. 6 shows a configuration of a quantum computer including four oscillators 40. However, it is possible to realize a quantum computer in which an arbitrary number of oscillators 40 are integrated by using the configuration shown in FIG. 6 as a unit structure and connecting a plurality of such unit structures side by side. FIG. 7 shows an example of such a configuration. FIG. 7 shows a schematic diagram showing a configuration of a quantum computer 61 in which oscillators 40 are integrated. In the configuration shown in FIG. 7, each coupling circuit 41 is connected to four oscillators 40 as shown in FIG. 6. Further, each oscillator 40 is connected to one to four coupling circuits 41, and the oscillators 40 are arranged while shared (i.e., commonly used) by a plurality of unit structures, so that the unit structures shown in FIG. 6 is obtained. In the quantum computer 61, at least one oscillator 40 is connected to a plurality of coupling circuits 41. In particular, in the example shown in FIG. 7, at least one oscillator 40 is connected to four coupling circuits 41. Further, the quantum computer 61 can also be described as follows. The quantum computer 61 includes a plurality of oscillators 40, and each of the oscillators 40 is connected to one to four coupling circuits 41. The number of coupling circuits 41 to which respective oscillators 40 are connected corresponds to the number of unit structures in which these oscillators 40 are shared. In this way, in the example shown in FIG. 7, the quantum computer 61 includes a plurality of unit structures, and oscillators 40 are shared by a plurality of unit structures. Although 13 superconducting nonlinear oscillators are integrated in the example shown in FIG. 7, an arbitrary number of oscillators 40 can be integrated in a similar manner.

Note that illustration of the control unit 50 and the read-out unit 51 is omitted in FIG. 7 to facilitate the understanding of the drawing. However, in practice, the control of the oscillator 40 and the reading-out therefrom are performed by using the control unit 50 and the read-out unit 51. Further, the operating principle and the control method for a quantum computer are disclosed in Non-patent Literature 1, and the operating principle and the control method disclosed in Non-patent Literature 1 are also applied to the quantum computer shown in FIGS. 6 and 7.

According to this example embodiment, it is possible to provide a quantum computer in which both moderate non-linearity and a low loss are achieved, and the area occupied by the circuit can be reduced.

Note that a superconducting nonlinear oscillator according to the present disclosure can be applied to gate-type quantum computing circuits as well as to quantum annealing circuits.

Note that the present invention is not limited to the above-described example embodiments and various changes may be made therein without departing from the spirit and scope of the invention.

Although the present invention is described above with reference to example embodiments, the present invention is not limited to the above-described example embodiments. Various modifications that can be understood by those skilled in the art can be made to the configuration and details of the present invention within the scope of the invention.

This application is based upon and claims the benefit of priority from Japanese patent application No. 2019-133817, filed on Jul. 19, 2019, the disclosure of which is incorporated herein in its entirety by reference.

REFERENCE SIGNS LIST

10 OSCILLATOR
20 OSCILLATOR
40 OSCILLATOR
41 COUPLING CIRCUIT
50 CONTROL UNIT
51 READ-OUT UNIT
52 CAPACITOR
60 QUANTUM COMPUTER
61 QUANTUM COMPUTER
100 RESONATOR
101 FIRST SUPERCONDUCTING LINE
102 SECOND SUPERCONDUCTING LINE
103 FIRST JOSEPHSON JUNCTION
104 SECOND JOSEPHSON JUNCTION
105 FIRST PART
106 SECOND PART
110 LOOP CIRCUIT
120 CAPACITOR
130 JOSEPHSON JUNCTION
200 MAGNETIC-FIELD GENERATION UNIT
300 CURRENT APPLICATION UNIT
410 JOSEPHSON JUNCTION
411 CAPACITOR
412_1 SUPERCONDUCTOR
412_2 SUPERCONDUCTOR

What is claimed is:

1. A resonator comprising:
at least one loop circuit in which a first superconducting line, a first Josephson junction, a second superconducting line, and a second Josephson junction are connected in a ring shape;
at least one third Josephson junction provided separately from the Josephson junctions included in the loop circuit; and
a capacitor, wherein
the loop circuit, the third Josephson junction, and the capacitor are connected in a ring shape,
the third Josephson junction is connected to the loop circuit at a certain connection point,
and only the third Josephson junction, the first Josephson junction, and the second Josephson junction are directly connected to the connection point.

2. The resonator according to claim 1, wherein the number of the loop circuit is one.

3. The resonator according to claim 1, further comprising a current applying circuit for feeding a DC current to the third Josephson junction.

4. An oscillator comprising:
the resonator according to claim 1; and
a magnetic-field generating circuit for applying a magnetic field to the loop circuit.

5. A quantum computer comprising, as a unit structure, four oscillators each of which is an oscillator according to claim 4, and a coupling circuit configured to couple ring circuits with each other, each of the ring circuits including the capacitor, the loop circuit, and the third Josephson junction of a respective one of the four oscillators.

6. The quantum computer according to claim 5, wherein the coupling circuit couples a first set of oscillators including two of the four oscillators with a second set of oscillators including the other two of the four oscillators through a fourth Josephson junction, a first oscillator of the first set of oscillators is connected to one terminal of the fourth Josephson junction through a first capacitor, a second oscillator of the first set of oscillators is connected to the one terminal of the fourth Josephson junction through a second capacitor, a third oscillator of the second set of oscillators is connected to the other terminal of the fourth Josephson junction through a third capacitor, and a fourth oscillator of the second set of oscillators is connected to the other terminal of the fourth Josephson junction through a fourth capacitor.

7. The quantum computer according to claim 5, comprising a plurality of the unit structures, wherein the plurality of the unit structures share the same oscillator.

\* \* \* \* \*